(12) United States Patent
Yamanaka

(10) Patent No.: US 8,873,830 B2
(45) Date of Patent: Oct. 28, 2014

(54) METHOD FOR EXTRACTING CONTOUR OF PATTERN ON PHOTO MASK, CONTOUR EXTRACTION APPARATUS, METHOD FOR GUARANTEEING PHOTO MASK, AND METHOD FOR MANUFACTURING SEMICONDUCTOR DEVICE

(75) Inventor: Eiji Yamanaka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 286 days.

(21) Appl. No.: 13/427,206

(22) Filed: Mar. 22, 2012

(65) Prior Publication Data

US 2012/0243772 A1 Sep. 27, 2012

(30) Foreign Application Priority Data

Mar. 22, 2011 (JP) ................. 2011-063354

(51) Int. Cl.
*G06K 9/00* (2006.01)
*G06T 7/00* (2006.01)
*G03F 1/86* (2012.01)

(52) U.S. Cl.
CPC .............. *G03F 1/86* (2013.01); *G06T 7/0004* (2013.01); *G06T 2207/10061* (2013.01); *G06T 2207/30148* (2013.01); *G06T 7/0085* (2013.01)
USPC ........................................................ 382/144

(58) Field of Classification Search
USPC ........................................................ 382/144
See application file for complete search history.

(56) References Cited

U.S. PATENT DOCUMENTS

| | | | |
|---|---|---|---|
| 7,313,781 B2 | 12/2007 | Asano et al. | |
| 7,409,309 B2 * | 8/2008 | Nitta et al. | 702/127 |
| 7,454,051 B2 | 11/2008 | Hirano et al. | |
| 7,673,281 B2 | 3/2010 | Yamanaka et al. | |
| 7,831,085 B2 | 11/2010 | Hirano et al. | |
| 8,330,104 B2 * | 12/2012 | Matsumoto | 250/310 |
| 2005/0238221 A1 | 10/2005 | Hirano et al. | |
| 2005/0265592 A1 | 12/2005 | Asano et al. | |
| 2008/0028361 A1 | 1/2008 | Yamanaka et al. | |
| 2009/0087081 A1 | 4/2009 | Hirano et al. | |
| 2011/0206271 A1 * | 8/2011 | Fukaya et al. | 382/144 |
| 2011/0208477 A1 * | 8/2011 | Hitomi et al. | 702/167 |

FOREIGN PATENT DOCUMENTS

| | | |
|---|---|---|
| JP | 11-237231 | 8/1999 |
| JP | 2008-294451 | 12/2008 |
| JP | 2009-122199 A | 6/2009 |
| JP | 2011-043458 | 3/2011 |

OTHER PUBLICATIONS

First Office Action, issued by Japanese Patent Office, mailed Feb. 18, 2014, in Japanese application No. 2011-063354 (6 pages including translation).

* cited by examiner

*Primary Examiner* — Stephen R Koziol
*Assistant Examiner* — Totam Le
(74) *Attorney, Agent, or Firm* — Finnegan, Henderson, Farabow, Garrett & Dunner, LLP

(57) ABSTRACT

According to one embodiment, a method includes acquiring information about a two-dimensional distribution of secondary electron intensity for a measurement target pattern, extracting, by a first method, an edge position of an edge for correction value acquisition, extracting, by a second method, an edge position of the edge for correction value acquisition, acquiring a difference between the edge positions extracted by the first and second methods, as a correction value, extracting, by the second method, an edge position of a desired edge based on the information about the two-dimensional distribution, and correcting the edge position of the desired edge based on the correction value.

14 Claims, 4 Drawing Sheets

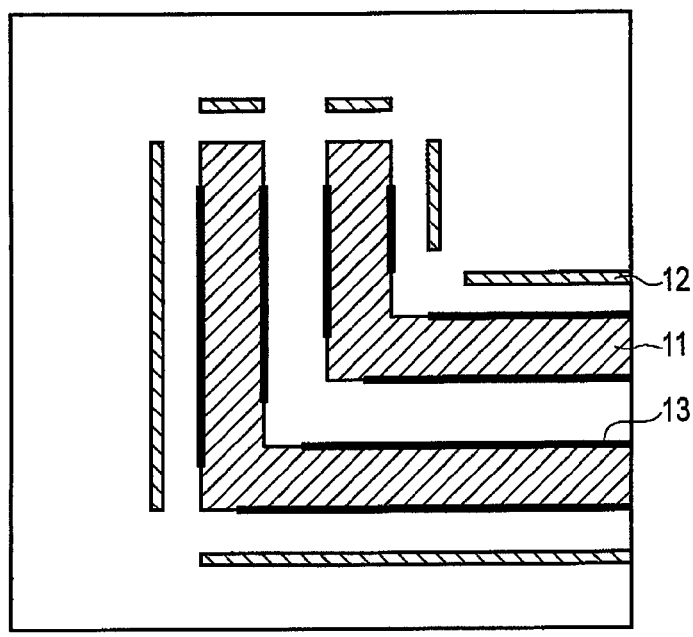
F I G. 2
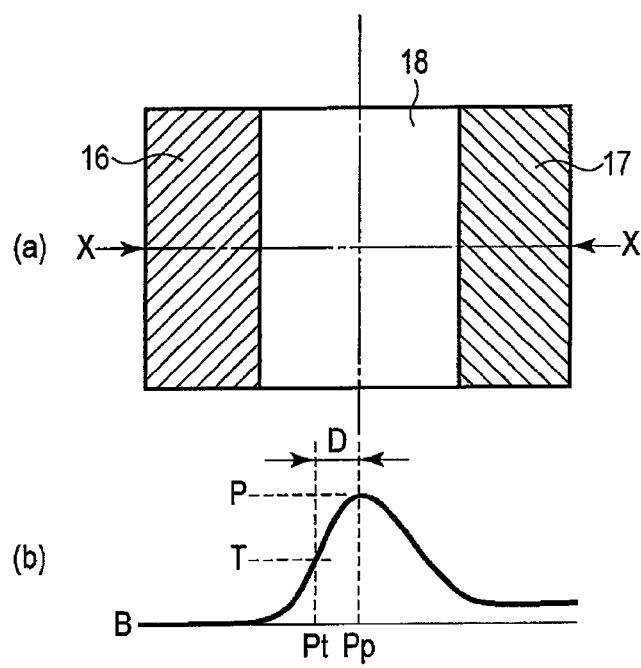
F I G. 3

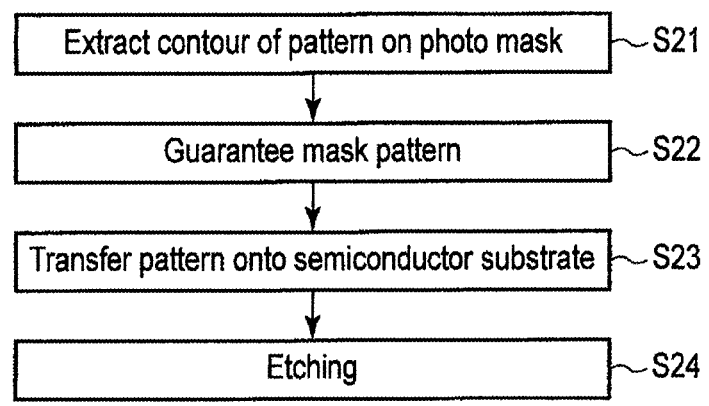
F I G. 6

METHOD FOR EXTRACTING CONTOUR OF PATTERN ON PHOTO MASK, CONTOUR EXTRACTION APPARATUS, METHOD FOR GUARANTEEING PHOTO MASK, AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2011-063354, filed Mar. 22, 2011, the entire contents of which are incorporated herein by reference.

FIELD

Embodiments described herein relate generally to a method for extracting the contour of a pattern on a photo mask, a contour extraction apparatus, a method for guaranteeing a photo mask, and a method for manufacturing a semiconductor device.

BACKGROUND

Miniaturization of semiconductor integrated circuit devices has made difficult extraction of the contour of a mask pattern formed on a photo mask. This has led to the need to extract the contour of the mask pattern by a scanning electron microscope (SEM) that uses charged particle beams.

In images obtained by SEM, a band-like area with a high secondary electron intensity or reflection electron intensity is observed at an edge of a pattern. The band-like area is commonly referred to as a white band.

A peak method and a threshold method are known as representative methods for extracting the contour of a mask pattern. The peak method detects the position of a peak intensity in the intensity distribution of a white band. The threshold method detects the position of an intermediate intensity in the intensity distribution of a white band. In general, the threshold method is excellent in short-term reproducibility. The peak method is excellent in long-term stability.

The reason for the long-term stability of the peak method is as follows. Even with a variation in the width of a white band resulting from various error factors during acquisition of images (for example, a focus error, changes in a primary electron optical system, and vibration of electron beams caused by disturbance), the peak position in the intensity distribution of the white band remains almost unchanged. Thus, the peak method is often used for the contour extraction using SEM.

However, miniaturization of patterns has made the application of the peak method difficult. That is, miniaturized patterns require the addition of fine auxiliary patterns for OPC (Optical Proximity Correction). For example, auxiliary patterns called SRAFs (Sub-Resolution Assist Features) are fine patterns that are not transferred onto a wafer. In such fine patterns, white bands at adjacent edges overlap, and the adjacent white bands fail to be separated from each other. This makes the application of the peak method significantly difficult. On the other hand, the application of the threshold method is also difficult due to its inadequate long-term stability.

Thus, a method has been demanded which enables the contour of a pattern on a photo mask to be appropriately extracted.

BRIEF DESCRIPTION OF THE DRAWINGS

FIG. 2 is a diagram showing an edge for correction value acquisition;

FIG. 3 is a diagram illustrating the intensity distribution of a white band;

FIG. 6 is a flowchart illustrating a method for guaranteeing a photo mask and a method for manufacturing a semiconductor device.

DETAILED DESCRIPTION

In general, according to one embodiment, a method for extracting a contour of a pattern on a photo mask, the method includes: acquiring, by a scanning electron microscope, information about a two-dimensional distribution of secondary electron intensity or reflection electron intensity for a measurement target pattern formed on a photo mask; extracting, by a first method, an edge position of an edge for correction value acquisition included in the measurement target pattern based on the information about the two-dimensional distribution; extracting, by a second method, an edge position of the edge for correction value acquisition based on the information about the two-dimensional distribution; acquiring a difference between the edge position extracted by the first method and the edge position extracted by the second method, as a correction value; extracting, by the second method, an edge position of a desired edge included in the measurement target pattern based on the information about the two-dimensional distribution; and correcting the edge position of the desired edge based on the correction value.

Embodiments will be described below with reference to the drawings.

Embodiment 1

Figure 1:
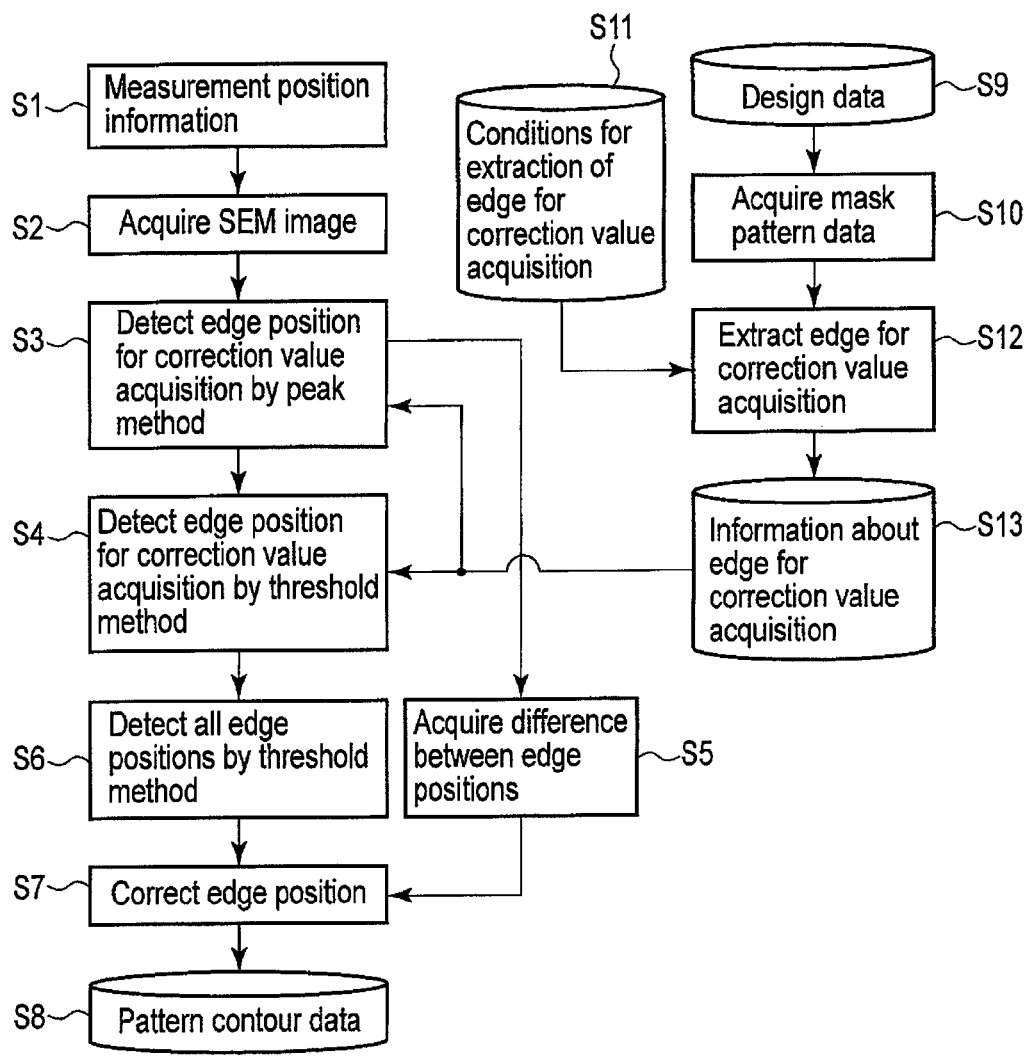
FIG. 1 is a flowchart illustrating a method for extracting the contour of a pattern on a photo mask according to a first embodiment.

FIG. 1 is a flowchart illustrating a method for extracting the contour of a pattern on a photo mask according to the present embodiment.

First, information on a measurement position in a pattern (mask pattern) on a photo mask is acquired (S1). Subsequently, in order to allow the acquisition, by a scanning electron microscope (SEM) using charged particle beams, of information about the two-dimensional distribution of secondary electron intensity or reflection electron intensity for the measurement target pattern formed on the photo mask, a scanning electron microscope image (SEM image) of the mask pattern is acquired for an area around the measurement position (S2). The two-dimensional distribution information may cover only the secondary electron intensity, only the reflection electron intensity, or the total of both electron intensities.

On the other hand, in order to allow the extraction of the edge position of an edge for correction value acquisition which is contained in the measurement target pattern, mask pattern data about an area containing the measurement target pattern is acquired from the design data of the measurement target pattern (S9, S10).

The area around the measurement position which is to undergo contour extraction is determined according to the purpose. For example, if lithography simulation is carried out based on finally obtained information about the contour of the mask pattern, the area is desirably sufficient to allow optical impacts to be taken into account. Furthermore, such a purpose requires measurement in an area located at an end of a memory cell array pattern or an area having a low lithography latitude and involving varying pattern regularity. Such an area often contains a fine pattern called SRAF. SRAF is an auxiliary pattern that is not transferred onto a wafer during exposure and that has a very small pattern size. Thus, white bands generated at the respective opposite edges of SRAF may overlap. In such a case, detecting the edge position by the peak method is difficult.

To avoid the above-described problem, the present embodiment detects the edge position using a combination of the peak method with the threshold method as described below.

First, an area is determined for which the intensity distributions of white bands generated at respective adjacent edges (the opposite edges of the same pattern or respective edges of adjacent patterns which lie opposite each other) are sufficiently separated from each other. An edge that is contained in this area is extracted as an edge for correction value acquisition. A white band in a corner of a pattern is different, in width, from a white band in a linear portion of the pattern. Thus, the vicinity of the corner of the pattern is preferably excluded from the edge for correction value acquisition.

FIG. 2 shows an edge for correction value acquisition. A pattern to be transferred onto a wafer during exposure is shown at 11. An SRAF pattern is shown at 12 and corresponds to an auxiliary pattern that is not transferred onto a wafer during exposure. An edge for correction value acquisition is shown at 13.

The edge for correction value acquisition is determined based on the distance between adjacent patterns, on the basis of design data about the measurement target pattern. That is, the edge for correction value acquisition is determined based on the width of a pattern to which the edge for correction value acquisition belongs and the distance between the edge for correction value acquisition and an edge adjacent to the edge for correction value acquisition. Conditions for the extraction of an edge for correction value acquisition (S11, the distance between adjacent patterns, the excluded area close to the corner of the pattern, and the like) depend on the resolution of SEM, the material of the mask pattern, and conditions for a process for forming the mask pattern. Thus, the conditions for the extraction of an edge for correction value acquisition are desirably predetermined based on the results of pre-evaluation of each of the combinations of conditions for SEM measurement and measurement targets.

Based on the above-described matters, an edge for correction value acquisition is extracted (S12). Moreover, based on information on the edge for correction value acquisition (S13), the intensity distribution of a white band in the edge area for correction value acquisition is analyzed.

FIG. 3 is a diagram illustrating the intensity distribution of a white band. FIG. 3(a) is a diagram showing the vicinity of an area in which the white band is observed. FIG. 3(b) is a diagram showing information on the intensity distribution of the white band. The intensity distribution information obtained is in the form of two-dimensional distribution information. However, for simplification of description, the intensity distribution information is shown as one-dimensional distribution information.

In FIG. 3(a), a non-pattern area is shown at 16 and is normally a quartz area (an area of a quartz substrate the surface of which is exposed). A pattern area is shown at 17 and is normally a light blocking area (an area of the quartz substrate on which a light blocking film is formed). A white band area is shown at 18. FIG. 3(b) shows the intensity distribution of an area along line X-X in FIG. 3(a).

In the present embodiment, for the white band at the edge of correction value acquisition, edge position extraction based on a first method and edge position extraction based on a second method are carried out. In actuality, the edge position is extracted based on the two-dimensional distribution information about the intensity distribution. However, for simplification, the description assumes that the edge position is extracted based on the one-dimensional distribution information.

The first method extracts the position Pp of the maximum intensity P in the intensity distribution as an edge of the pattern. A representative first method is the peak method, which extracts the position of a peak intensity in the intensity distribution. The second method extracts the position Pt of an intermediate intensity in the intensity distribution as an edge of the pattern. A representative second method is the threshold method, which extracts the position of the intermediate value T between the maximum value P and the minimum value B in the intensity distribution. The intermediate value T is not particularly limited but is desirably selected to allow the highest measurement reproducibility to be achieved under given measurement conditions. The description below assumes that the peak method is used as the first method and that the threshold method is used as the second method.

As described above, the edge position is detected by each of the peak method and the threshold method (S3, S4). Moreover, the difference D between the edge position extracted by the peak method and the edge position extracted by the threshold method is determined as correction value (S5). If a plurality of edges for correction value acquisition are present, the average of the differences D acquired for the respective edges for correction value acquisition may be determined as a correction value.

Moreover, the edge position of the desired edge contained in the measurement target pattern is detected by the threshold method. Specifically, the edge positions of all the edges contained in the measurement target pattern are detected by the threshold method (S6). The use of the threshold method enables the edge position to be detected even if white bands at the respective adjacent edges overlap.

All the edge positions detected by the threshold method as described above are corrected using the correction value obtained in step S5 (S7). Specifically, the value of the difference D obtained in step S5 (including a plus sign or a minus sign) is added to each of the edge positions. This allows a corrected edge position to be calculated for all the edges. As a result, data about the contour of the mask pattern (S8) is finally obtained.

As described above, in the present embodiment, an area is determined for which the intensity distributions of white bands generated at the respective adjacent edges are sufficiently separated from each other. An edge contained in the area is then extracted as an edge for correction value acquisition. Then, for the edge for correction value acquisition, the edge position is extracted by each of the first method (peak method) and the second method (threshold method). Moreover, the difference between the two edge positions obtained by the peak method and the threshold method is used as a correction value to correct the edge positions of all the edges obtained by the threshold method.

As described above, for the peak method, in spite of its high long-term stability, detecting the peak position is difficult if the white bands at the adjacent edges overlap. On the other hand, the threshold method enables the edge position to be extracted even if the white bands at the adjacent edges overlap, but is disadvantageous in that this method is inferior in long-term stability. That is, for the threshold method, the detected edge position is disadvantageously affected by a variation in white band width. The variation in white band width results from changes in the electron optical system, focus errors, image fluctuation caused by disturbance, and the like, and is impossible to eliminate completely.

In the present embodiment, for the edge for which the peak position can be reliably acquired by the peak method (the edge for correction value acquisition), the difference D between the peak position obtained by the peak method and the peak position obtained by the threshold method is determined and added to each of all the edges determined by the threshold method. Thus, for all the edges, the edge position can be very stably and accurately detected as is the case with the peak method. Therefore, the present embodiment enables the contour of a pattern on a photo mask to be appropriately and accurately extracted.

An error may occur between the edge position detected based on SEM images and the actual edge position. To calibrate such errors, the following method can be used. First, an SEM image of a reference pattern for which the edge position is known is acquired. The edge position is extracted from the SEM image by the peak method. Then, the difference between the edge position extracted by the peak method and the known edge position is determined as a calibration value. The calibration value is reflected in the above-described method according to the present embodiment. As a result, the above-described error can be calibrated. For example, the calibration value may be added to the edge position obtained by the above-described method according to the present embodiment.

Embodiment 2

Now, a second embodiment will be described. The present embodiment is directed to a contour extraction apparatus configured to carry out the method for extracting a contour as described in the first embodiment.

Figure 4:
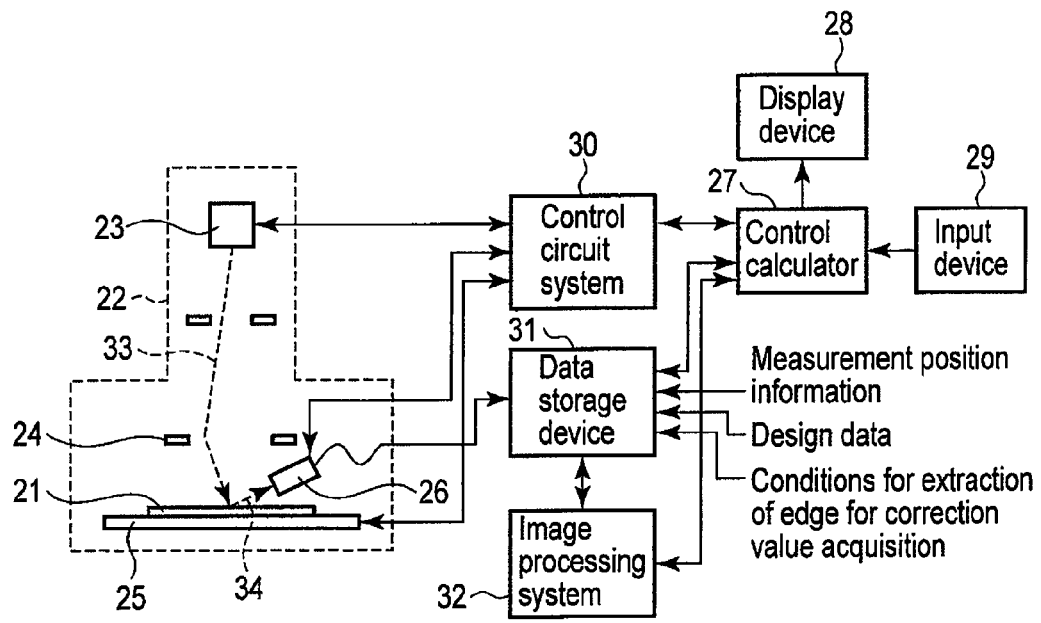
FIG. 4 is a diagram illustrating the structure of a contour extraction apparatus according to a second embodiment.

FIG. 4 is a diagram illustrating a configuration of the contour extraction apparatus according to the present embodiment. The various functions described in the first embodiment are implemented by the apparatus shown in FIG. 4.

The present apparatus roughly comprises a scanning electron microscope (SEM) 22, and an electronic calculator and an electronic circuit which are configured to control SEM 22 and process images acquired by SEM 22.

SEM 22 comprises an XY stage 25, an electron gun 23, an electron optical system 24, and a secondary electron detection section 26. A photo mask 21 is loaded on the XY stage 25, which is then moved to any position. The electron gun 23 emits electrons. The electron optical system 24 controllably guides a primary electron beam 33 emitted from the electron gun 23, to the photo mask 21. The secondary electron detection section 26 detects a secondary electron 34 emitted from the photo mask 21. The sections of SEM 22 are controlled in accordance with control signals received from a control calculator 27 via a control circuit system 30.

The electronic calculator and the electronic circuit comprise the control circuit system 30 configured to control SEM, and the control calculator 27 configured to transmit control signals to the control circuit system 30. The control calculator 27 connects to a data storage device 31 configured to store various data and an image processing system 32 configured to analyze SEM images. The image processing system 32 is installed to speed up processing and need not necessarily be provided. For example, the functions of the image processing system 32 can be executed instead by the control calculator 27 or another calculator via software. Furthermore, the control calculator 27 connects to a display device 28 configured to display information for an operator and an input device 29 configured to enable the operator to input information.

Operation using the apparatus in FIG. 4 will be described below.

First, the operator performs an operation for loading the photo mask 21 on the XY stage 25. Based on measurement position information stored in the data storage device 31, the control calculator 27 transmits a control signal to the XY stage 25 via the control circuit system 30. This allows a measurement target pattern on the photo mask 21 to be positioned in the center of an image acquisition area of SEM 22. Subsequently, the control calculator 27 controls the electron optical system 24 via the control circuit system 30 to allow appropriate images to be obtained. That is, the control calculator 27 controllably allows the accurate acquisition of images of the mask pattern without distortion or defocusing. Moreover, the control calculator 27 transmits an instruction to SEM 22 via the control circuit system 30 in order to acquire a secondary electron image of the mask pattern. The image acquired is stored in the data storage device 31.

Based on the SEM image obtained as described above, a process for extracting the contour of the mask pattern is carried out. In the process for extracting the contour, first, data about the mask pattern included in the SEM image is retrieved from design data and from the measurement position information; the design data and the measurement position information are both stored in the data storage device 31. Then, a process for extracting an edge for correction value acquisition is carried out in accordance with conditions for the extraction of an edge for correction value acquisition. The process for extraction is similar to the process in step 12 in FIG. 1. That is, an edge is extracted for which the intensity distributions of white bands generated at the edge and an adjacent edge are sufficiently separated from each other to allow the peak positions in the intensity distributions to be accurately detected.

Based on the SEM image stored in the data storage device 31, the image processing system 32 executes a process for extracting the edge position. In the process for extracting the edge position, for the edge for correction value acquisition, information about the intensity distributions of the white bands is analyzed. This process for analysis is similar to the processing in steps S3, S4, and S5 in FIG. 1. That is, the following processes are carried out: the process for detecting the edge position by the peak method, the process for detecting the edge position by the threshold method, and the process for determining the difference between the two edge positions as a correction value.

Then, the image processing system 32 carries out a process for extraction using the threshold method, on all the edge positions contained in the SEM image stored in the data storage device 31. Moreover, all the edge positions extracted by the threshold method are corrected by the previously determined difference between the edge positions (correction value). Thus, the final data on the contour of the mask pattern is obtained.

As described above, the use of the apparatus according to the present embodiment allows the edge position to be very stably and accurately detected as is the case with the first embodiment. Consequently, the contour of the pattern on the photo mask can be appropriately and accurately extracted.

If there is any error between the edge position detected based on the SEM image and the actual edge position, calibration may be carried out using a calibration value as described in the first embodiment.

Figure 5:
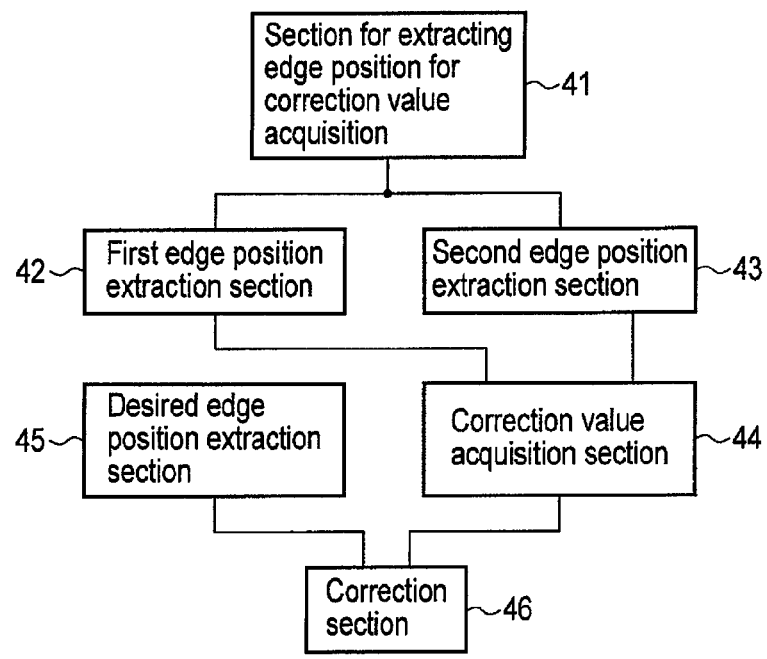
FIG. 5 is a functional block diagram of the contour extraction apparatus.

Furthermore, as is apparent from the above description, the contour extraction based on the two-dimensional distribution information about the image acquired by SEM is carried out mainly by the control calculator 27, the control circuit system 30, the data storage device 31, and the image processing system 32. FIG. 5 is a functional block diagram illustrating functions to carry out such contour extraction.

A section 41 for extracting an edge position for correction value acquisition acquires an edge for correction value acquisition contained in the measurement target pattern based on the design data about the measurement target pattern in order to acquire the edge position of the edge for correction value acquisition.

A first edge position extraction section 42 uses the first method to extract the edge position of the edge for correction value acquisition based on the two-dimensional distribution information acquired by SEM. That is, the edge position is extracted by the peak method. A second edge position extraction section 43 uses the second method to extract the edge position of the edge for correction value acquisition based on the two-dimensional distribution information acquired by SEM. That is, the edge position is extracted by the threshold method.

A correction value acquisition section 44 acquires the difference between the edge position extracted by the first method and the edge position extracted by the second method, as a correction value.

A desired edge position extraction section 45 extracts the edge position of the desired edge contained in the measurement target pattern by the second method based on the two-dimensional distribution information acquired by SEM.

A correction section 46 corrects the edge position of the desired edge extracted by the desired edge position extraction section 45 based on the correction value acquired by the correction value acquisition section 44.

In the above-described embodiment, the first method, that is, the method for determining the peak position in the intensity distribution of the white band, may determine the secondary differentiation of the intensity distribution. Furthermore, the second method, that is, the method for determining the intermediate intensity position in the intensity distribution of the white band, may determine the differentiation of the intensity distribution.

Additionally, the method according to the above-described embodiment can generally be applied to the following case. That is, the method according to the above-described embodiment is effective if the mask pattern includes an area for which the intensity distributions of white bands generated at respective adjacent edges (the opposite edges of the same pattern or respective edges of adjacent patterns which lie opposite each other) are sufficiently separated and an area for which separation of the intensity distributions of white bands generated at respective adjacent edges is difficult. In such a case, for the area for which the intensity distributions are sufficiently separated from each other, the edge positions are determined by the first and second methods, and the difference between the edge positions is determined as a correction value. Furthermore, for the area for which the separation of the intensity distributions is difficult, the edge position may be determined by the second method and corrected using the correction value.

The above-described method can be applied to a method for guaranteeing a photo mask and a method for manufacturing a semiconductor device. FIG. 6 is a flowchart illustrating the method for guaranteeing a photo mask and the method for manufacturing a semiconductor device.

First, the contour of a pattern on a photo mask is extracted based on the method according to the above-described method (S21). Then, the mask pattern is checked based on the data about the extracted contour. Based on the results of the check, the mask pattern is guaranteed (S22). Then, the guaranteed mask is used to transfer the pattern onto a semiconductor substrate (S23). That is, the pattern is transferred to a photo resist formed on the semiconductor substrate to form a pattern of the photo resist. Moreover, a conductive film, an insulating film, or a semiconductor film is etched through the pattern of the photo resist as a mask (S24).

As described above, the photo mask is guaranteed, and the semiconductor device is manufactured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for extracting a contour of a pattern on a photo mask, the method comprising:

acquiring, by a scanning electron microscope, information about a two-dimensional distribution of secondary electron intensity or reflection electron intensity for a measurement target pattern formed on a photo mask;

extracting, by a first method, an edge position of an edge for correction value acquisition included in the measurement target pattern based on the information about the two-dimensional distribution;

extracting, by a second method, an edge position of the edge for correction value acquisition based on the information about the two-dimensional distribution;

acquiring a difference between the edge position extracted by the first method and the edge position extracted by the second method, as a correction value;

extracting, by the second method, an edge position of a desired edge included in the measurement target pattern based on the information about the two-dimensional distribution; and correcting the edge position of the desired edge based on the correction value, wherein the edge for correction value acquisition is determined based on design data about the measurement target pattern.

2. The method according to claim 1, wherein the first method comprises determining a position of a peak intensity in an intensity distribution of a white band included in the information about the two-dimensional distribution.

3. The method according to claim 1, wherein the second method comprises determining a position of an intermediate intensity in an intensity distribution of a white band included in the information about the two-dimensional distribution.

4. The method according to claim 1, wherein the edge for correction value acquisition is determined based on a width of a pattern to which the edge for correction value acquisition belongs.

5. The method according to claim 1, wherein the edge for correction value acquisition is determined based on a distance between the edge for correction value acquisition and an edge adjacent to the edge for correction value acquisition.

6. The method according to claim 1, wherein the edge for correction value acquisition is included in an area for which an intensity distribution of a white band generated at the edge for correction value acquisition is separated from an intensity distribution of a white band generated at an edge adjacent to the edge for correction value acquisition.

7. An apparatus configured to extract a contour of a pattern on a photo mask, the apparatus comprising:
 a scanning electron microscope configured to acquire information about a two-dimensional distribution of secondary electron intensity or reflection electron intensity for a measurement target pattern formed on a photo mask; and
 a controller configured to:
  extract, by a first method, an edge position of an edge for correction value acquisition included in the measurement target pattern based on the information about the two-dimensional distribution;
  extract, by a second method, an edge position of the edge for correction value acquisition based on the information about the two-dimensional distribution;
  acquire a difference between the edge position extracted by the first method and the edge position extracted by the second method, as a correction value;
  extract, by the second method, an edge position of a desired edge included in the measurement target pattern based on the information about the two-dimensional distribution; and
  correct the edge position of the desired edge based on the correction value,
 wherein the edge for correction value acquisition is determined based on design data about the measurement target pattern.

8. The apparatus according to claim 7, wherein the first method comprises determining a position of a peak intensity in an intensity distribution of a white band included in the information about the two-dimensional distribution.

9. The apparatus according to claim 7, wherein the second method comprises determining a position of an intermediate intensity in an intensity distribution of a white band included in the information about the two-dimensional distribution.

10. The apparatus according to claim 7, wherein the edge for correction value acquisition is determined based on a width of a pattern to which the edge for correction value acquisition belongs.

11. The apparatus according to claim 7, wherein the edge for correction value acquisition is determined based on a distance between the edge for correction value acquisition and an edge adjacent to the edge for correction value acquisition.

12. The apparatus according to claim 7, wherein the edge for correction value acquisition is included in an area for which an intensity distribution of a white band generated at the edge for correction value acquisition is separated from an intensity distribution of a white band generated at an edge adjacent to the edge for correction value acquisition.

13. A method for guaranteeing a photo mask, the method comprising guaranteeing a mask pattern based on data about the contour extracted by the method according to claim 1.

14. A method for manufacturing a semiconductor device, the method comprising transferring a pattern onto a semiconductor substrate using a photo mask guaranteed by a method for guaranteeing a photo mask,
 wherein the method for guaranteeing the photo mask includes guaranteeing a mask pattern based on data about the contour extracted by the method according to claim 1.

* * * * *